(12) United States Patent
Richter et al.

(10) Patent No.: US 6,458,664 B2
(45) Date of Patent: Oct. 1, 2002

(54) METHOD FOR FABRICATING A FIELD-EFFECT TRANSISTOR HAVING AN ANTI-PUNCH-THROUGH IMPLANTATION REGION

(75) Inventors: Frank Richter, Weixdorf; Dieter Temmpler, Dresden, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/726,960

(22) Filed: Nov. 30, 2000

(30) Foreign Application Priority Data

Nov. 30, 1999 (DE) .......................................... 199 57 540

(51) Int. Cl.$^7$ ............................................. H01L 21/336
(52) U.S. Cl. ....................... 438/291; 438/197; 438/302; 438/305; 438/585
(58) Field of Search ................................. 438/291, 302, 438/305, 197, 231, 564, 259, 270, 303, 585, 589, 299, 221, 301, 306, 230, 319, 421, 574

(56) References Cited

U.S. PATENT DOCUMENTS

| 5,429,956 A | * | 7/1995 | Shell et al. | 438/291 |
| 5,548,143 A | * | 8/1996 | Lee | 257/269 |
| 5,686,321 A | | 11/1997 | Ko et al. | |
| 5,747,356 A | * | 5/1998 | Lee et al. | 438/282 |
| 6,078,086 A | * | 6/2000 | Park | 257/386 |
| 6,978,086 | * | 6/2000 | Park | 257/386 |
| 6,124,177 A | * | 9/2000 | Lin et al. | 438/305 |
| 6,169,003 B1 | * | 1/2001 | Hu et al. | 438/299 |
| 6,232,160 B1 | * | 5/2001 | Shih et al. | 438/197 |

FOREIGN PATENT DOCUMENTS

| DE | 42 08 537 C2 | 11/1992 |
| DE | 43 41 509 A1 | 6/1995 |

* cited by examiner

*Primary Examiner*—Matthew Smith
*Assistant Examiner*—Igwe U. Anya
(74) *Attorney, Agent, or Firm*—Laurence A. Greenberg; Werner H. Stemer; Gregory L. Mayback

(57) ABSTRACT

A simple method for fabricating a field-effect transistor having an anti-punch-through implantation region is provided. After the anti-punch-through implantation region is formed, a semiconductor substrate is locally oxidized by using a mask layer in order to form a gate insulation layer. The method allows the fabrication of field-effect transistors having improved short-channel properties.

13 Claims, 3 Drawing Sheets

METHOD FOR FABRICATING A FIELD-EFFECT TRANSISTOR HAVING AN ANTI-PUNCH-THROUGH IMPLANTATION REGION

BACKGROUND OF THE INVENTION

FIELD OF THE INVENTION

The invention relates to a method for fabricating a field-effect transistor having an anti-punch-through implantation region. The invention also relates an improved transistor structure for DRAM one-transistor memory cells having feature sizes of less than 0.15 µm.

When fabricating large-scale integrated memory devices such as DRAM memories, it becomes increasingly difficult, with feature sizes or structure sizes of less than 0.15 µm, to produce transistors having not only an excellent leakage current behavior with $I_{off}$<10 fA (fF) per transistor, which is essential for the charge retention time, or retention time, in a one-transistor memory cell but it becomes also difficult to produce transistors having a sufficient ON current for charge storage of >30 µA per transistor. At the same time, it is desirable to realize low threshold voltages of approximately 0.8 V in conjunction with an external voltage supply of just 1.6 V, for example.

FIGS. 1a and 1b show a simplified sectional view of essential method steps for fabricating a field-effect transistor having an anti-punch-through implantation region in accordance with the prior art, as is disclosed for example in U.S. Pat. No. 5,686,321.

Since the so-called punch-through effect is a major problem particularly when fabricating large-scale integrated field-effect transistors, anti-punch-through implantation regions are increasingly used, particularly in the case of short-channel transistors. These anti-punch-through implantation regions reduce an excessive expansion of a depletion region or space charge zone in the channel region and thereby increase a punch-through voltage.

By way of example, anti-punch-through implantation regions of this type are implanted in a self-aligning manner locally between respective source/drain regions, as a result of which feature sizes of ≦0.15 µm can be realized.

In accordance with FIG. 1a, in such a conventional method for fabricating a field-effect transistor having an anti-punch-through implantation region, first of all a gate insulation layer 20 is formed over the whole area of a semiconductor substrate 10. Subsequently, a nitride layer 30 is deposited as a mask layer and patterned accordingly in order to form respective gate regions GB. Furthermore, polysilicon spacers 50 are formed on the edge regions of the cut-out for the gate region GB, and act as additional masking for the subsequent implantation $I_1$. In this case, in the course of the implantation $I_1$, using the polysilicon spacers 50 and the nitride mask layer 30, impurities are introduced locally into a channel region of the semiconductor substrate 10, thereby forming the anti-punch-through implantation region 40.

In accordance with FIG. 1b, in subsequent steps of the conventional method for fabricating a field-effect transistor having an anti-punch-through implantation region 40, the spacers 50 are removed and the cut-out for the gate region GB is filled with a gate layer in order to form a gate electrode or control electrode 60. Subsequently, the nitride mask layer 30 is removed and, using the gate electrode 60, a further implantation $I_2$ is carried out in order to form source/drain regions S and D in the semiconductor substrate 10.

A field-effect transistor having improved short-channel properties which can be fabricated in a self-aligning manner is obtained in this way. A disadvantage of this conventional fabrication method, however, is in particular the use of additional method steps for forming the masking spacers 50 and the implantation through the gate insulation layer 20. The implantation through the gate insulation layer 20, in particular, can adversely effect the quality of the gate insulation layer, thereby impairing the transistor properties of the short-channel transistor.

SUMMARY OF THE INVENTION

It is accordingly an object of the invention to provide a method for fabricating a field-effect transistor having an anti-punch-through implantation region which overcomes the above-mentioned disadvantages of the heretofore-known methods of this general type and which can be realized cost-effectively and yields improved transistor properties in combination with reduced feature sizes.

With the foregoing and other objects in view there is provided, in accordance with the invention, a method for fabricating a field-effect transistor having an anti-punch-through implantation region, the method includes the steps of:

forming a mask layer on a surface of a semiconductor substrate;

selectively removing a given region of the mask layer for forming a gate region;

forming an implantation mask layer on a surface of the mask layer in a region including the gate region;

forming an anti-punch-through implantation region in the semiconductor substrate at the gate region by implanting impurities;

removing the implantation mask layer;

forming, at the gate region, a gate insulation layer on the surface of the semiconductor substrate;

forming a gate layer in the gate region;

removing the mask layer; and forming source/drain regions in the semiconductor substrate by using the gate layer as a mask.

In other words, the method according to the invention includes the following steps:

a) formation of a mask layer on the surface of a semiconductor substrate;

b) selective removal of predetermined regions of the mask layer in order to form gate regions;

c) formation of an implantation mask layer on the surface of the mask layer with the gate regions;

d) implantation of impurities in order to form the anti-punch-through implantation region in the semiconductor substrate of the gate region;

e) whole-area removal of the implantation mask layer;

f) formation of a gate insulation layer on the surface of the semiconductor substrate in the gate region;

g) formation of a gate layer in the gate region;

h) removal of the mask layer; and i) formation of source/drain regions in the semiconductor substrate using the gate layer as a mask.

As a result, in particular, of the formation of an implantation mask layer, which can be easily realized, for the formation of the anti-punch-through implantation region and the subsequent formation of a gate insulation layer, a short-channel field-effect transistor having improved properties is obtained since the gate insulation layer is spared the bombardment of impurities during an implantation.

The implantation mask layer is preferably produced by depositing a homogeneous insulating layer from the vapor phase, resulting in a particularly cost-effective method for forming the implantation mask layer, which, in particular, enables the reliable fabrication of planar transistors having a feature size of less than 0.1 μm. As a result, it is possible to achieve a further reduction in a cell area of large-scale integrated one-transistor memory cells, such as e.g. in DRAMs. Also, an alternative solution which is complicated in terms of production engineering, such as e.g. vertical transistors, can be avoided.

The implantation of impurities for the purpose of forming the anti-punch-through implantation region is preferably effected vertically or in an oblique or inclined manner. Thus a local channel implantation for a central or a slightly offset channel region of the field-effect transistor is achieved through the use of self-aligning masking technology. In this way, it is possible to further reduce high local field strengths in source/drain regions and to realize high saturation currents in the turned-on field-effect transistor.

According to another mode of the invention, an $SiO_2$ layer is used as the implantation mask layer.

According to yet another mode of the invention, the gate insulation layer is formed by thermally oxidizing the semiconductor substrate.

According to a further mode of the invention, an $SiO_2$ layer is used as the gate insulation layer.

According to another mode of the invention, weakly and heavily doped source/drain regions are formed. The heavily doped source/drain regions are formed by using spacers disposed laterally at the gate layer.

According to yet another mode of the invention, the step of forming the source drain regions includes implanting further impurities.

According to another mode of the invention, an $Si_3N_4$ hard mask is used as the mask layer.

According to a further mode of the invention, a polysilicon layer and/or a $WSi_x$ layer is used as the gate layer.

Other features which are considered as characteristic for the invention are set forth in the appended claims.

Although the invention is illustrated and described herein as embodied in a method for fabricating a field-effect transistor having an anti-punch-through implantation region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
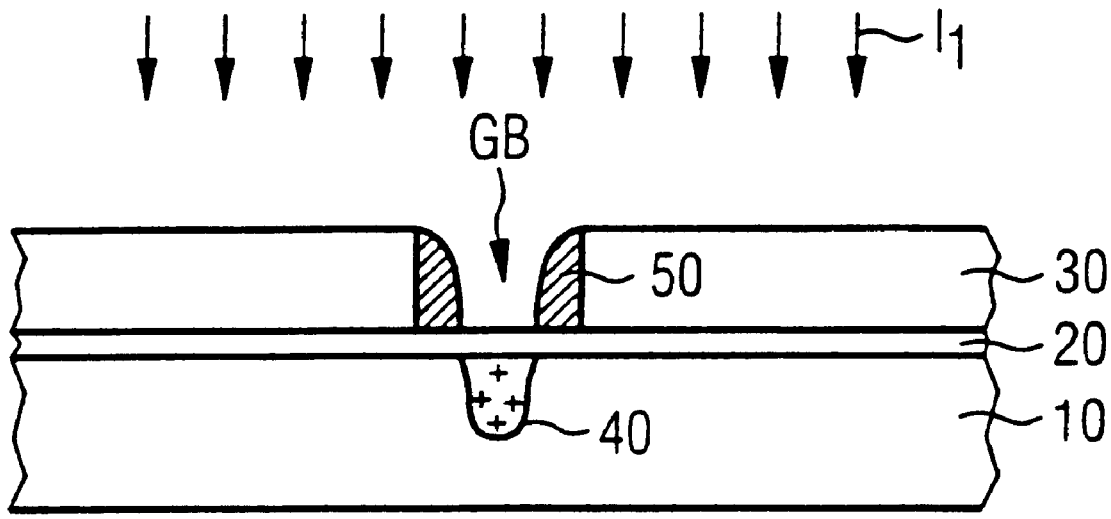
FIGS. 1a and 1b are partial, diagrammatic sectional views of semiconductor structures for illustrating essential method steps for fabricating a field-effect transistor having an anti-punch-through implantation region in accordance with the prior art.
Figure 1B:
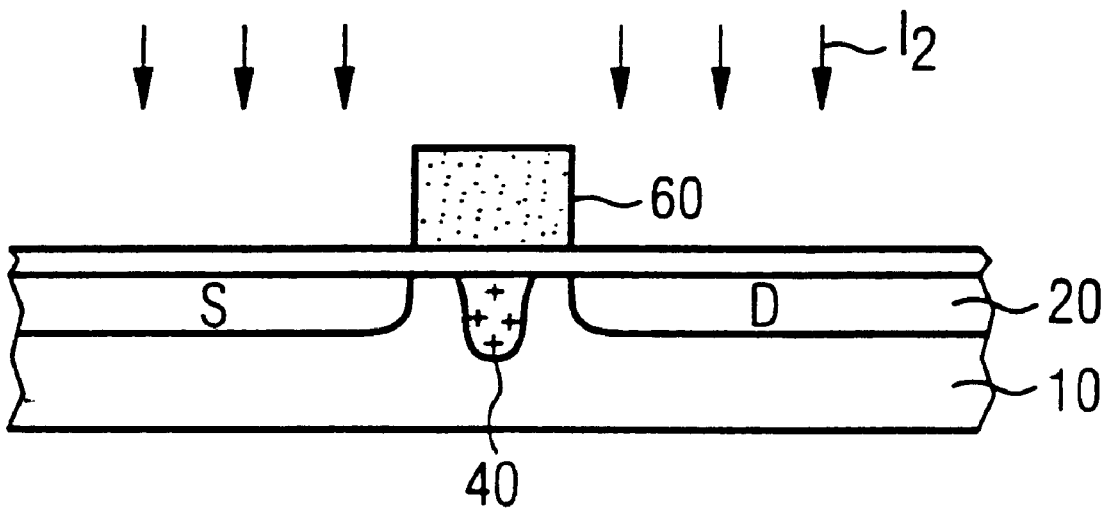
Figure 2A:
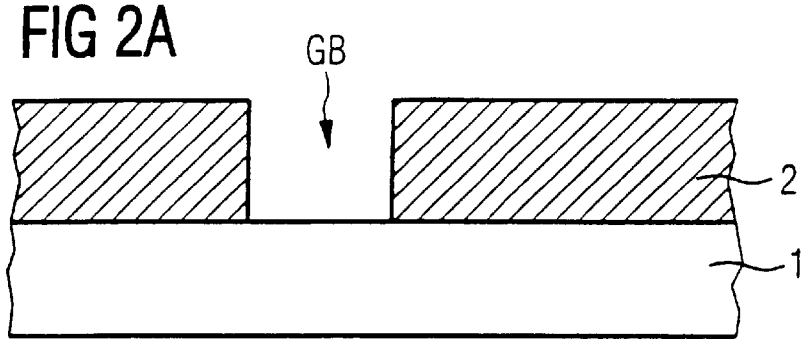
FIGS. 2a to 2g are partial, diagrammatic sectional views of semiconductor structures for illustrating essential method steps for fabricating a field-effect transistor having an anti-punch-through implantation region in accordance with the invention.

The invention is described with reference to the figures of the drawings, in which identical reference symbols indicate identical or similar elements or operations. In the method step in accordance with FIG. 2a, first of all a mask layer 2 is formed on the surface of a semiconductor substrate 1 and patterned or structured accordingly, thereby producing gate regions GB. The semiconductor substrate 1 is preferably composed of Si, SiGe, SiC, SOI, GaAs or some other III-V semiconductor. A hard mask such as e.g. a nitride layer is preferably used for the mask layer 2, a so-called inverse gate hard mask being produced as a result of the patterning or the formation of the gate regions GB. As an alternative to the preferred $Si_3N_4$ layer, it is also possible to use other mask layers for the purpose of forming the gate regions GB.

Figure 2B:
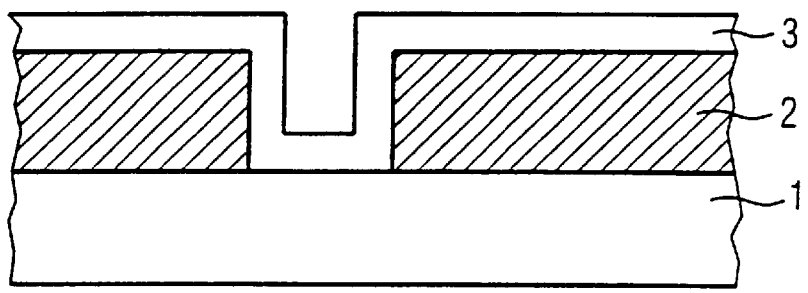

In a subsequent method step in accordance with FIG. 2b, a relatively thin implantation mask layer 3 is then formed over the whole area. The implantation mask layer 3 is preferably formed by depositing a homogenous insulating layer from a vapor phase, as a result of which the implantation mask layer 3 of the uniform thickness, as illustrated in FIG. 2b, is obtained. The implantation mask layer 3 is preferably composed of an $SiO_2$ layer and is formed using a conventional vapor phase deposition method not described in any specific detail below. However, the implantation mask layer 3 may also be composed of further materials and/or be deposited through the use of other conventional methods.

Figure 2C:
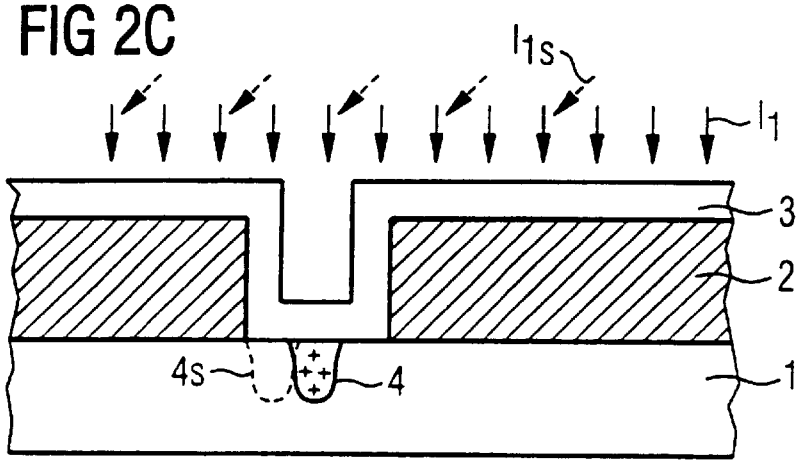

In a method step in accordance with FIG. 2c, a vertical implantation $I_1$ or optionally an inclined implantation $I_{1s}$ then takes place in order to implant impurities in the semiconductor substrate 1. In this case, using the mask layer 2 and the overlying implantation mask layer 3, the anti-punch-through implantation region 4 is formed centered or laterally offset in the semiconductor substrate 1 at the location of the gate region GB or a corresponding channel region. On account of the homogenous layer thickness of the implantation mask layer 3, the implantation mask layer 3 running vertically in the gate region GB along the edges of the mask layer 2 acts like an additional mask, as a result of which the anti-punch-through implantation region 4 or 4s is formed centered or slightly laterally offset only in a local region of the gate region GB in the semiconductor substrate 1 or the corresponding channel region.

In this case, the implantation mask layer 3 running horizontally in the gate region GB or in the cut-out formed through the mask layer 2 does not constitute a significant obstacle to the implantation $I_1$ or $I_{1s}$, for which reason, relatively low implantation energies can be used. Accordingly, the masking effect outside the gate region GB is realized essentially by the mask layer 2. Since it is relatively simple to fabricate such an implantation mask layer 3, a cost-effective method for fabricating a short-channel field-effect transistor for feature sizes of less than 0.1 μm is achieved.

In order to improve the anti-punch-through behavior or in order to further prevent a punch-through effect, as a result of the inclined implantation $I_{1s}$, the anti-punch-through implantation region 4s can, depending on the drain/source voltages used, be moved or displaced towards a drain/source region that is defined or formed later. As a result, local field strengths can be further compensated and improved saturation currents are obtained for the field-effect transistor.

Figure 2D:
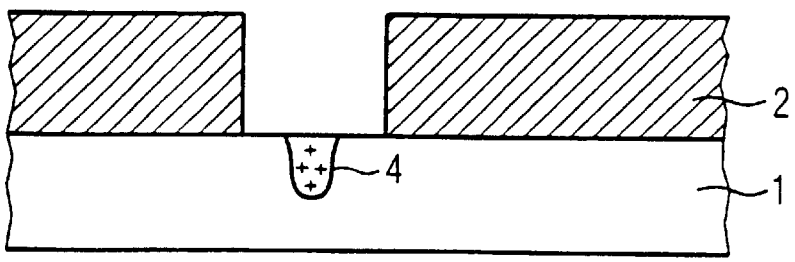

In a subsequent method step in accordance with FIG. 2d, the implantation mask layer 3, which is essentially used as a sacrificial layer, is then removed over the whole area through the use of a conventional etching method.

Figure 2E:
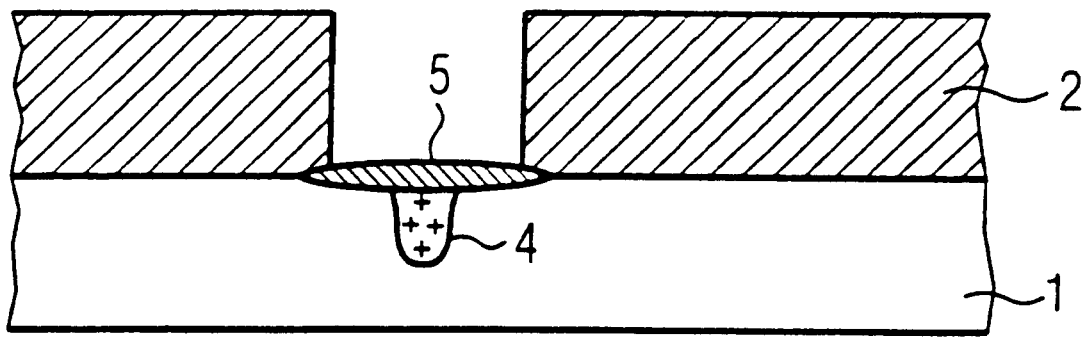

In a method step in accordance with FIG. 2e, a gate insulation layer 5 is then formed locally on the surface of the semiconductor substrate in the gate region GB. This local formation of the gate insulation layer 5 is preferably implemented with a thermal oxidation method using the mask layer 2 as a mask. In this case, by way of example, conventional thermal oxidation is carried out to oxidize the semiconductor substrate 1 locally in the gate region GB, as a result of which an $SiO_2$ gate insulation layer 5 is formed, for example, when Si is used as the semiconductor substrate 1.

In this case, particularly in contrast to the conventional method described above, this gate insulation layer 5 has outstanding electrical properties, and therefore may also be used as a tunnel oxide for so-called non-volatile one-transistor semiconductor memory cells (e.g. flash memories). In this case, a slight oxidation under the mask layer 2 is not a disadvantage since it is compensated particularly in the course of a subsequent formation of source/drain regions, preferably through the use of spacer technology.

In contrast to the conventional method, moreover, all options are equally available with regard to a selection of dopants, since a respectively different damage to a gate insulation layer by the respective dopants is irrelevant in view of the subsequent formation of the gate insulation layer in accordance with the invention. The degree of freedom in realizing the anti-punch-through implantation regions, in particular, is thereby greatly improved.

Figure 2F:
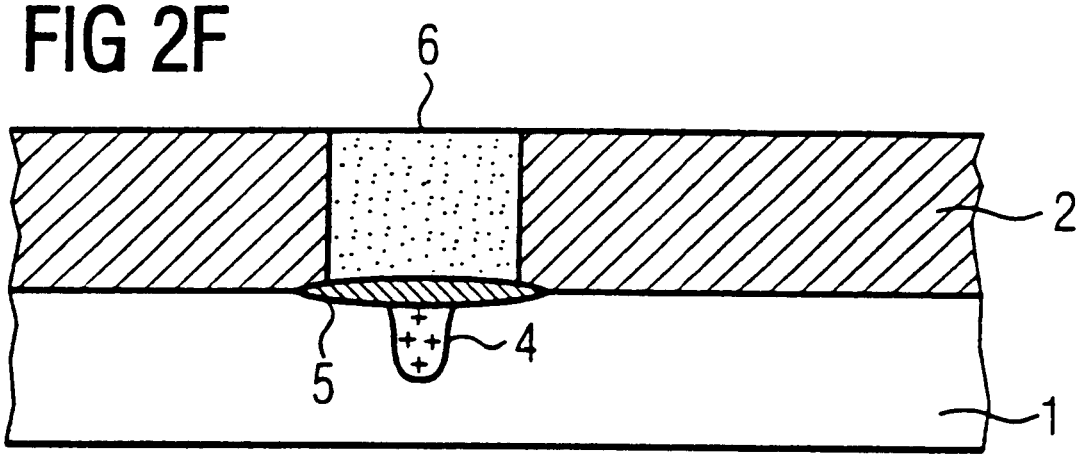

In accordance with FIG. 2f, in subsequent method steps, a gate layer or gate electrode 6 is formed in the gate region GB. In this case, a polysilicon layer is preferably deposited over the whole area and removed using a selective etching method down to the mask layer 2, thereby producing, in the first instance, a half-filled cut-out in the gate region GB. Subsequently, if the gate layer 6 is provided as a multilayer structure, a $WSi_x$ layer, for example, may be deposited over the whole area and once again planarized for example through the use of CMP (chemical mechanical polishing) down to the mask layer 2, thereby obtaining the sectional view illustrated in FIG. 2f.

However, the gate electrode or gate layer 6 may also be composed of a single electrically conductive material and/or be formed selectively in the cut-out for the gate region GB. What is essential to the present invention, however, is the mask layer 2, which is still present and in this way enables self-aligning processes for all essential implantation and patterning operations with regard to the gate region GB.

Figure 2G:
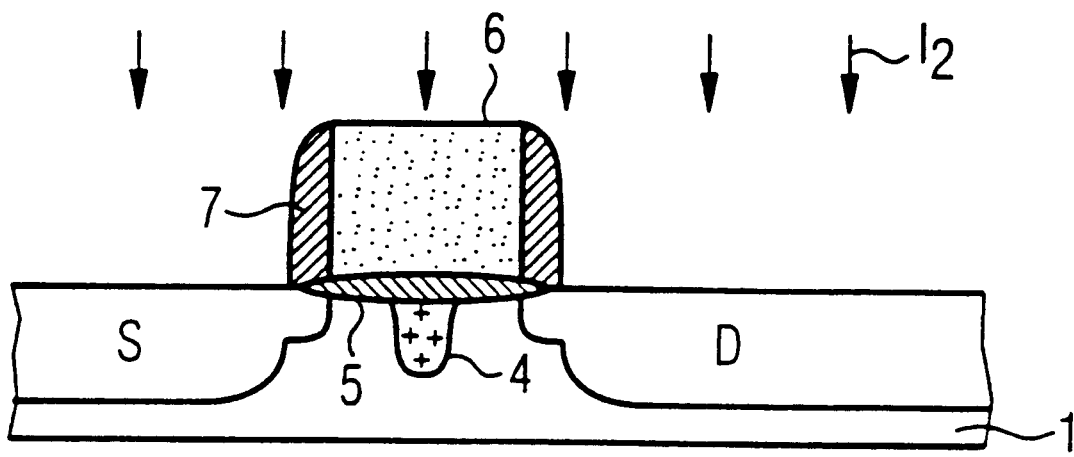

In accordance with FIG. 2g, in subsequent steps, first of all the mask layer 2 is removed and, by way of example, using the gate electrode or gate layer 6 as a mask, weakly doped source/drain regions SID (LDD, lightly doped drain) are formed in the semiconductor substrate 1. Preferably, in a subsequent step, spacer layers 7 are formed on the side walls of the gate electrode or gate layer 6 and a further (heavy) doping is carried out for the self-aligning formation of heavily doped source/drain regions (HDD, highly doped drain).

This doping of the source/drain regions S/D is preferably effected through the use of one or more further ion implantations $I_2$, but diffusion methods are also possible, in principle.

In order to improve the transistor properties further, it is possible, moreover, to carry out a side wall oxidation and a so-called "junction annealing" in order to anneal respective pn junctions. A short-channel field-effect transistor having improved electrical properties is obtained in this way. Such a transistor can be realized simply and cost-effectively in particular for large-scale integrated circuits with a feature size of $\leq 0.15$ µm.

The invention has been described above with reference to a field-effect transistor for a DRAM one-transistor memory cell. However, it is not restricted thereto but rather encompasses all applications of short-channel field-effect transistors, as can also be used, for example, in non-volatile semiconductor memory cells with a charge-storing layer (flash, EEPROM, EPROM) and other circuits having short-channel field-effect transistors.

The present invention has been described, in particular, with reference to an n-channel MOSFET yet it is not restricted thereto but rather encompasses all other field-effect transistor structures and combinations and, in particular, also the p-channel MOSFET.

We claim:

1. A method for fabricating a field-effect transistor having an anti-punch-through implantation region, the method which comprises:

forming a mask layer on a surface of a semiconductor substrate;

selectively removing a given region of the mask layer for forming a gate region;

forming an implantation mask layer on a surface of the mask layer in a region including the gate region;

forming an anti-punch-through implantation region in the semiconductor substrate at the gate region by implanting impurities through the implantation mask;

removing the implantation mask layer;

forming, at the gate region, a gate insulation layer on the surface of the semiconductor substrate;

forming a gate layer in the gate region;

removing the mask layer; and forming source/drain regions in the semiconductor substrate by using the gate layer as a mask.

2. The method according to claim 1, which comprises forming the implantation mask layer by depositing a homogeneous insulating layer from a vapor phase.

3. The method according to claim 1, which comprises using an $SiO_2$ layer as the implantation mask layer.

4. The method according to claim 1, which comprises forming the gate insulation layer by thermally oxidizing the semiconductor substrate.

5. The method according to claim 1, which comprises using an $SiO_2$ layer as the gate insulation layer.

6. The method according to claim 1, which comprises forming the anti-punch-through implantation region centered in the gate region by implanting the impurities vertically with respect to the mask layer.

7. The method according to claim 1, which comprises forming the anti-punch-through implantation region laterally offset in the gate region by obliquely implanting the impurities.

8. The method according to claim 1, wherein the step of forming the source/drain regions includes:

forming weakly doped source/drain regions; and forming heavily doped source/drain regions by using spacers disposed laterally at the gate layer.

9. The method according to claim 1, wherein the step of forming the source drain regions includes implanting further impurities.

10. The method according to claim 1, which comprises using an $Si_3N_4$ hard mask as the mask layer.

11. The method according to claim 1, which comprises using a polysilicon layer as the gate layer.

12. The method according to claim 1, which comprises using a $WSi_x$ layer as the gate layer.

13. The method according to claim 1, which comprises using a polysilicon layer and a $WSi_x$ layer as the gate layer.

* * * * *